United States Patent
Yamamoto

(10) Patent No.: US 7,852,177 B2
(45) Date of Patent: Dec. 14, 2010

(54) DOUBLE-TUNING CIRCUIT OF TELEVISION TUNER

(75) Inventor: Masaki Yamamoto, Fukushima-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 159 days.

(21) Appl. No.: 12/258,211

(22) Filed: Oct. 24, 2008

(65) Prior Publication Data

US 2009/0167467 A1 Jul. 2, 2009

(30) Foreign Application Priority Data

Dec. 28, 2007 (JP) .............................. 2007-339882

(51) Int. Cl.
*H03J 3/02* (2006.01)
(52) U.S. Cl. .............................. 334/1; 334/15; 348/731; 455/180.4; 455/191.2; 455/302
(58) Field of Classification Search ...................... 334/1, 334/15, 61, 65, 78; 348/731; 455/180.4, 455/191.2, 302
See application file for complete search history.

(56) References Cited

U.S. PATENT DOCUMENTS 5,285,179 A * 2/1994 Wignot et al. .................. 334/15
6,950,152 B2 * 9/2005 Yamamoto .................. 348/731

FOREIGN PATENT DOCUMENTS

| EP | 0 584 732 | 3/1994 |
|---|---|---|
| EP | 1 931 028 | 6/2008 |
| JP | 5-235703 | 9/1993 |
| JP | 3108713 | 2/2005 |
| WO | 00/11783 | 3/2000 |

OTHER PUBLICATIONS

European Search Report dated Mar. 24, 2009 from European Application No. 08021919.9.

* cited by examiner

*Primary Examiner*—Benny Lee
(74) *Attorney, Agent, or Firm*—Beyer Law Group LLP

(57) ABSTRACT

In a double-tuning circuit including a primary tuning circuit having a first inductor and a first variable capacitive element connected in parallel and a secondary tuning circuit having a second inductor and a second variable capacitive element connected in parallel, a fixed part of a copper-foil pattern is connected to a connection point at which the double-tuning circuit is connected to an input terminal of a frequency mixing circuit, and a tip part of the copper-foil pattern extends to near the first inductor, whereby a trap circuit for attenuating an image frequency component is formed. A pattern is formed between a ground-side terminal of the first inductor and the ground, and a capacitor is connected between a connection point at which the first inductor is connected to one terminal of the pattern and a ground-side terminal of the second variable capacitive element.

2 Claims, 8 Drawing Sheets

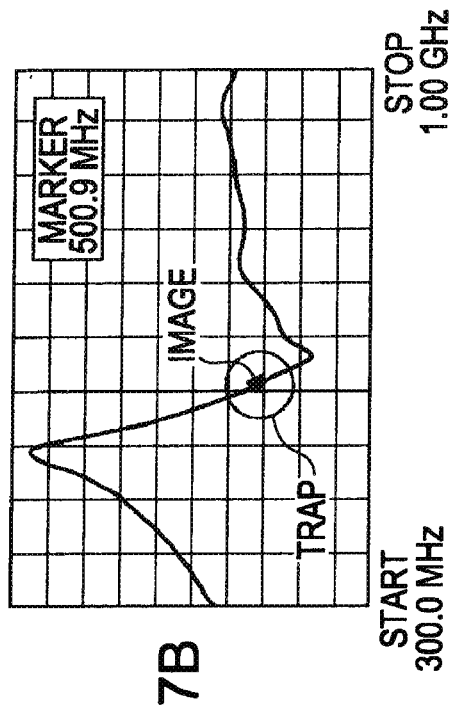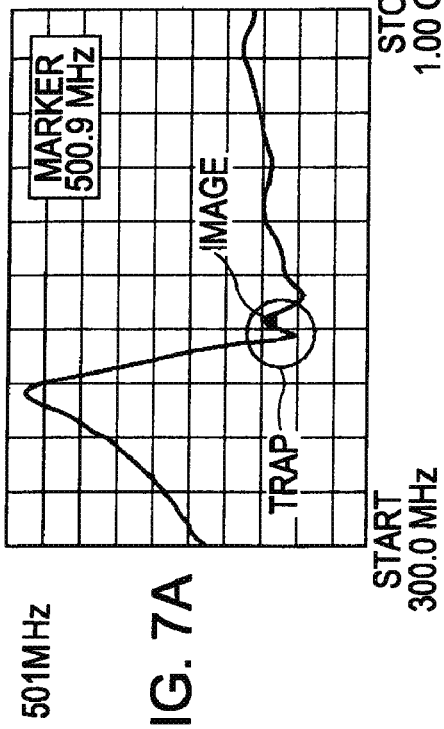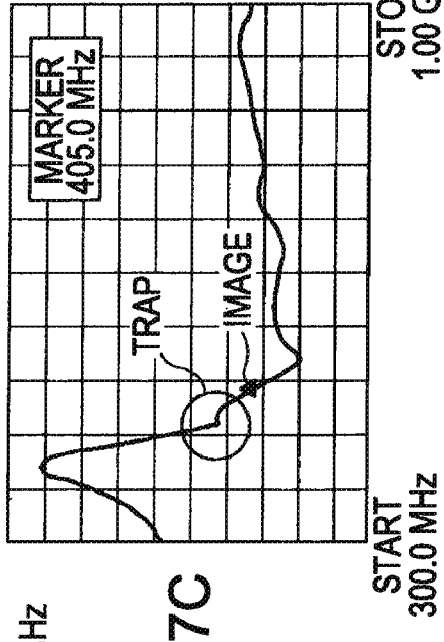
FIG. 7A
FIG. 7B
FIG. 7C
FIG. 7D

DOUBLE-TUNING CIRCUIT OF TELEVISION TUNER

CLAIM OF PRIORITY

This application claims benefit of the Japanese Patent Application No. 2007-339882 filed on Dec. 28, 2007, which is hereby incorporated by reference.

BACKGROUND OF THE INVENTION

1. Field of the Invention

The present invention relates to a double-tuning circuit of a television tuner, the double-tuning circuit including a trap circuit that is formed therein to attenuate an image frequency component of a television signal.

2. Description of the Related Art

In general, a double-tuning circuit of a television tuner is provided between a radio frequency (RF) amplifier circuit for amplifying a received television signal and a frequency mixing circuit for converting a television signal into an intermediate-frequency signal so as to connect the RF amplifier circuit and the frequency mixing circuit. Such a double-tuning circuit usually includes a primary tuning circuit in which a first inductor is connected in parallel with a first variable capacitive element and a secondary tuning circuit in which a second inductor is connected in parallel with a second variable capacitive element, and the first and the second inductors are inductively coupled. Some double-tuning circuits of a television tuner of this type include an image trap circuit that is formed therein and that attenuates an image frequency component of a television signal. Many methods have been proposed for forming such an image trap circuit, and one of them is a method employing an adjustable copper-foil pattern (see Japanese Registered Utility Model No. 3108713).

FIG. 9 is a diagram showing a structure of a double-tuning circuit of a television tuner disclosed in Japanese Registered Utility Model No. 3108713.

The double-tuning circuit of the television tuner shown in FIG. 9 includes a first inductor 1, a second inductor 2, a first variable capacitive element 3, a second variable capacitive element 4, direct-current (DC) blocking capacitors 5 and 6, a first coupling capacitor 7, two second coupling capacitors 8(1) and 8(2) that are serially connected, buffer resistors 9 and 10, a copper-foil pattern 11, a hot-side input terminal 12H, a cold-side input terminal 12C, a hot-side output terminal 13H, a cold-side output terminal 13C, and a tuning voltage application terminal 14. In this case, the two second coupling capacitors 8(1) and 8(2) that are serially connected are selected in such a manner that the total capacitance thereof is identical to the capacitance of a second coupling capacitor of this type whose capacitance is known.

The first inductor 1 and the first variable capacitive element 3 connected in parallel constitute the primary tuning circuit, and the second inductor 2 and the second variable capacitive element 4 connected in parallel constitute the secondary tuning circuit. One terminal of a circuit portion constituted by the two second coupling capacitors 8(1) and 8(2) that are serially connected is connected to the hot-side output terminal 13H, and the other terminal thereof is connected to a hot-side input terminal 16H. A fixed part of the copper-foil pattern 11 is connected to a connection point at which the two second coupling capacitors 8(1) and 8(2) are connected to each other, and a tip part 11a of the copper-foil pattern 11, that is a free end thereof, extends to near the first inductor 1.

Moreover, an upstream circuit of the double-tuning circuit of the television tuner includes a hot-side output terminal 15H, a cold-side output terminal 15C, a radio frequency amplifier (RF AMP) 17, an antenna input terminal 18, an inductor 19, feedback resistors 20 and 21, a bypass capacitor 22, and a power-source terminal 23. Furthermore, a downstream circuit of the double-tuning circuit of the television tuner includes the hot-side input terminal 16H, a cold-side input terminal 16C, a frequency mixing circuit (MIX) 24, a local oscillator (L OSC) 25, and an intermediate-frequency signal output terminal 26.

In the double-tuning circuit of the television tuner having the above-described structure, a trap circuit for attenuating an image frequency component in an RF signal is formed by coupling the first inductor 1 and the tip part 11a of the copper-foil pattern 11, and the capacitance of the trap circuit is an infinitesimal capacitance generated by coupling the first inductor 1 and the tip part 11a of the copper-foil pattern 11. This trap circuit can attenuate an image frequency component in an RF signal. The image frequency component to be attenuated by the trap circuit can be adjusted by changing the capacitance ratio between the two second coupling capacitors 8(1) and 8(2) without changing the total capacitance of the two second coupling capacitors 8(1) and 8(2).

In an example of the related art described in Japanese Registered Utility Model No. 3108713, the image frequency component to be attenuated by the trap circuit can be adjusted by changing the capacitance ratio between the two second coupling capacitors 8(1) and 8(2). Moreover, a trap frequency can be adjusted by adjusting the infinitesimal capacitance generated by coupling the first inductor 1 and the tip part 11a of the copper-foil pattern 11 or by adjusting a degree of coupling between the first inductor 1 and the second inductor 2 (the distance between the inductors).

However, even if a trap frequency is adjusted to the image frequency of a specific channel by adjusting the capacitance ratio between the two second coupling capacitors 8(1) and 8(2), the infinitesimal capacitance generated using the copper-foil pattern 11, or the distance between the inductors, the trap frequency does not match the image frequency of another channel. Thus, resistance to image degradation cannot be uniformly achieved between channels.

The present invention has been made in light thereof, and the present invention provides a double-tuning circuit of a television tuner capable of realizing resistance to image degradation uniformly between channels over a wide band.

SUMMARY OF THE INVENTION

A double-tuning circuit of a television tuner according to the present invention includes a primary tuning circuit in which a first inductor is connected in parallel with a first variable capacitive element, a secondary tuning circuit in which a second inductor is connected in parallel with a second variable capacitive element, the second inductor being inductively coupled to the first inductor, a coupling capacitor connected in series between a hot-side output terminal of the secondary tuning circuit and an input terminal of a downstream circuit, a pattern used to form a trap circuit for attenuating an image frequency component of a received television signal, the trap circuit being formed to have an infinitesimal capacitance generated between a tip part of the pattern and the first inductor when a fixed part of the pattern is connected to a connection point at which the coupling capacitor is connected to the input terminal of the downstream circuit and the tip part of the pattern extends to near the first inductor, a third inductor formed between a ground-side terminal of the first inductor and a ground, a first capacitor connected between a connection point at which the first inductor is connected to the third inductor and a ground-side terminal of the second variable capacitive element, and a second capacitor connected between a ground-side terminal of the second variable capacitive element and the ground.

With this structure, a circuit structure is provided in which the secondary tuning circuit, which has a secondary tuning capacitance, is grounded via the third inductor. Thus, because of frequency characteristics of the third inductor, loose coupling occurs in radio frequencies, and a degree of coupling increases as a tuning frequency is lowered. Thus, a trap frequency can be corrected between channels and resistance to image degradation can be uniformly achieved between channels.

In the double-tuning circuit of the television tuner, the pattern may be formed of a copper-foil pattern.

According to the present invention, in the double-tuning circuit of the television tuner, a trap frequency can be corrected between channels and resistance to image degradation can be uniformly achieved over a wide band.

BRIEF DESCRIPTION OF THE DRAWINGS

FIG. 7A is a diagram showing a relationship between the image frequency and the trap frequency in the comparative example when the tuning frequency is 501 MHz;

FIG. 7B is a diagram showing a relationship between the image frequency and the trap frequency in the embodiment of the present invention when the tuning frequency is 501 MHz;

FIG. 7C is a diagram showing a relationship between the image frequency and the trap frequency in the comparative example when the tuning frequency is 405 MHz;

FIG. 7D is a diagram showing a relationship between the image frequency and the trap frequency in the embodiment of the present invention when the tuning frequency is 405 MHz;

DESCRIPTION OF THE PREFERRED EMBODIMENTS

In the following, embodiments of the present invention will be specifically described with reference to the attached drawings.

Figure 1:
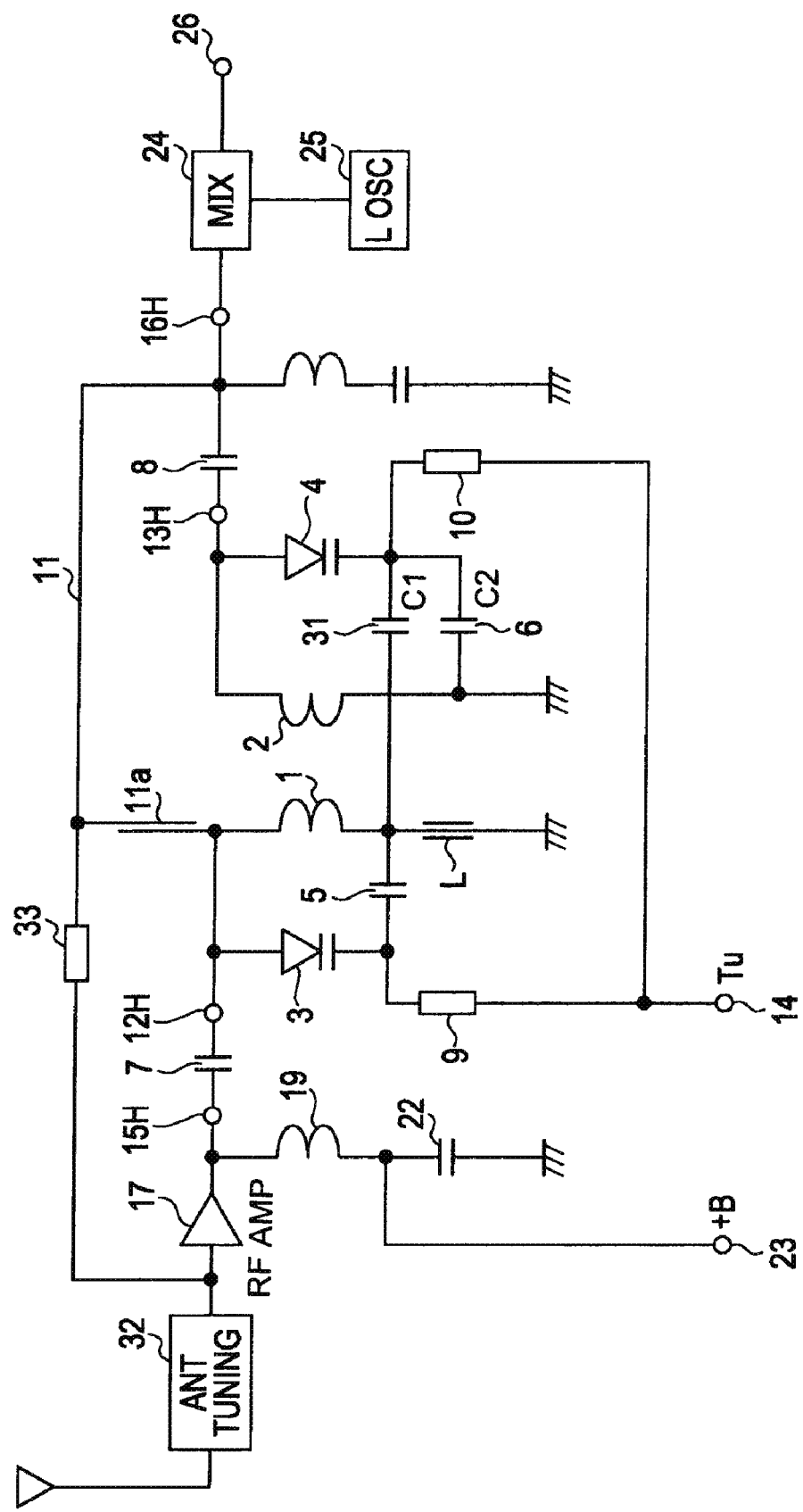
FIG. 1 is a diagram showing a structure of a double-tuning circuit of a television tuner according to an embodiment of the present invention.
Figure 9:
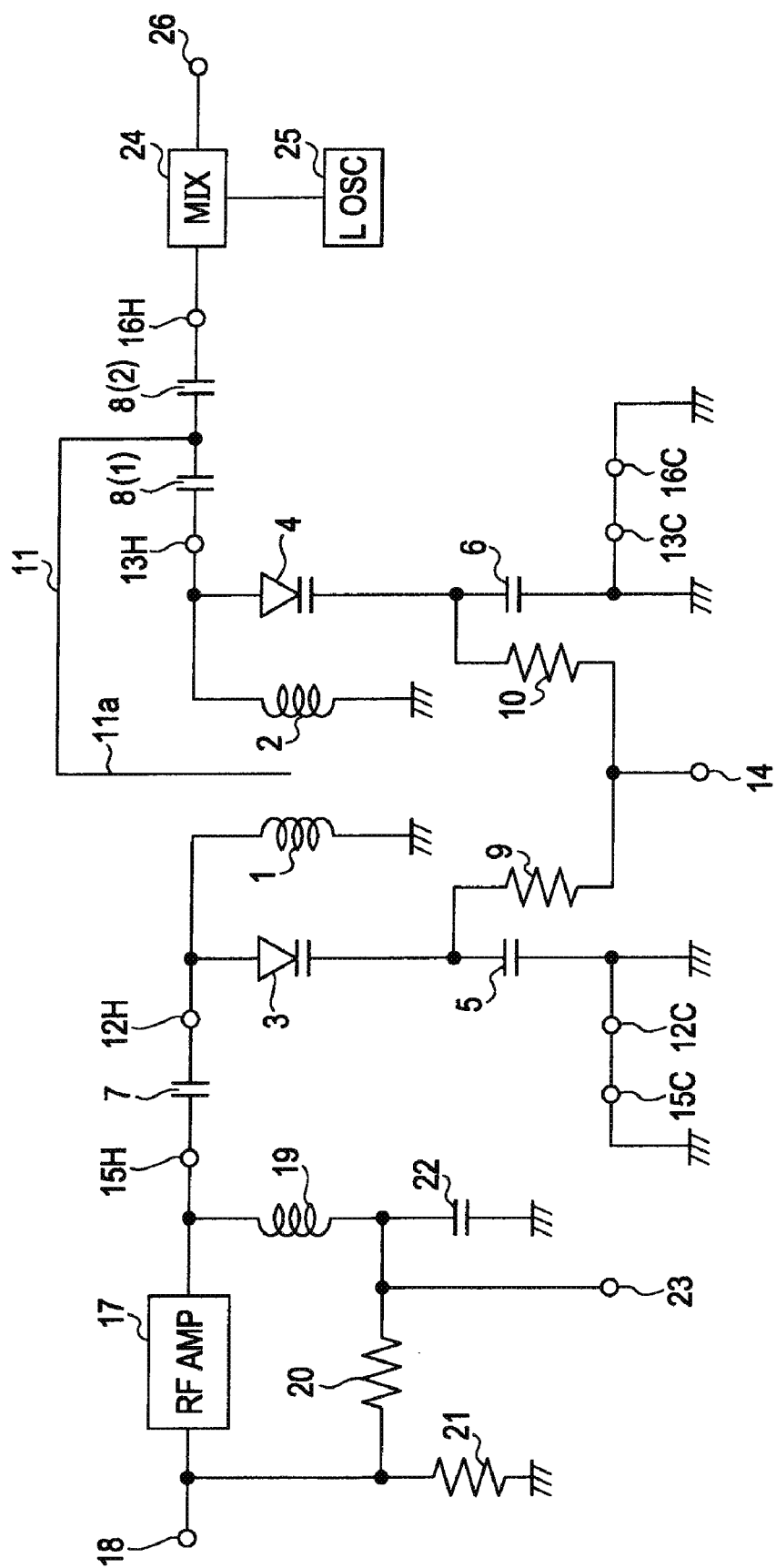
FIG. 9 is a diagram showing a structure of an existing double-tuning circuit of a television tuner.

FIG. 1 is a diagram showing a structure of a double-tuning circuit of a television tuner according to an embodiment of the present invention. Here, components the same as those indicated in the double-tuning circuit shown in FIG. 9 will be denoted by the same reference numerals.

One terminal of the first inductor 1 is connected to a connection point at which an anode of the first variable capacitive element 3 is connected to the hot-side input terminal 12H, and the other terminal of the first inductor 1 is connected to one terminal of a pattern L, which is a third inductor. The other terminal of the pattern L is grounded. One terminal of the second inductor 2 is connected to a connection point at which an anode of the second variable capacitive element 4 is connected to the hot-side output terminal 13H, and the other terminal of the second inductor 2 is directly grounded. A cathode of the first variable capacitive element 3 is connected to one terminal of the DC blocking capacitor 5 and one terminal of the buffer resistor 9. The other terminal of the DC blocking capacitor 5 is grounded via the pattern L. A cathode, which is a ground-side terminal, of the second variable capacitive element 4 is connected to one terminal of the DC blocking capacitor 6 serving as a second capacitor (capacitance C2) and one terminal of the buffer resistor 10, and is furthermore connected to one terminal of a capacitor 31 serving as a first capacitor (capacitance C1). The other terminal of the capacitor 31 is grounded via the pattern L. The other terminal of the DC blocking capacitor 6 is directly grounded. In this way, a secondary tuning circuit is configured to be grounded via the pattern L. The other terminals of the buffer resistors 9 and 10 are connected to the tuning voltage application terminal (Tu) 14. One terminal of the first coupling capacitor 7 is connected to the hot-side input terminal 12H, and the other terminal of the first coupling capacitor 7 is connected to the hot-side output terminal 15H. One terminal of a second coupling capacitor 8 is connected to the hot-side output terminal 13H, and the other terminal of the second coupling capacitor 8 is connected to the hot-side input terminal 16H. The fixed part of the copper-foil pattern 11 is connected to the hot-side input terminal 16H, which is a terminal between the frequency mixing circuit (MIX) 24 and the second coupling capacitor 8, and the tip part 11a, which is a free end of the copper-foil pattern 11, extends to near the first inductor 1. The first inductor 1 and the first variable capacitive element 3 connected in parallel constitute a primary tuning circuit, and the second inductor 2 and the second variable capacitive element 4 connected in parallel constitute a secondary tuning circuit.

In an upstream circuit of the double-tuning circuit of the television tuner, an input terminal of the radio frequency amplifier (RF AMP) 17 is connected to an output terminal of an antenna tuning circuit (ANT TUNING) 32 and one terminal of a feedback resistor 33, and an output terminal of the radio frequency amplifier (RF AMP) 17 is connected to the hot-side output terminal 15H and one terminal of the inductor 19. The other terminal of the inductor 19 is connected to one terminal of the bypass capacitor 22 and the power-source terminal (+B) 23. The other terminal of the bypass capacitor 22 is grounded.

In a downstream circuit of the double-tuning circuit of the television tuner, a first input terminal of the frequency mixing circuit (MIX) 24 is connected to the hot-side input terminal 16H, a second input terminal of the frequency mixing circuit (MIX) 24 is connected to an output terminal of the local oscillator (L OSC) 25, and an output terminal of the frequency mixing circuit (MIX) 24 is connected to the intermediate-frequency signal output terminal 26. Here, although cold-side input terminals and cold-side output terminals are not shown in FIG. 1, they can be configured basically similarly to the structure shown in FIG. 9.

Figure 2:
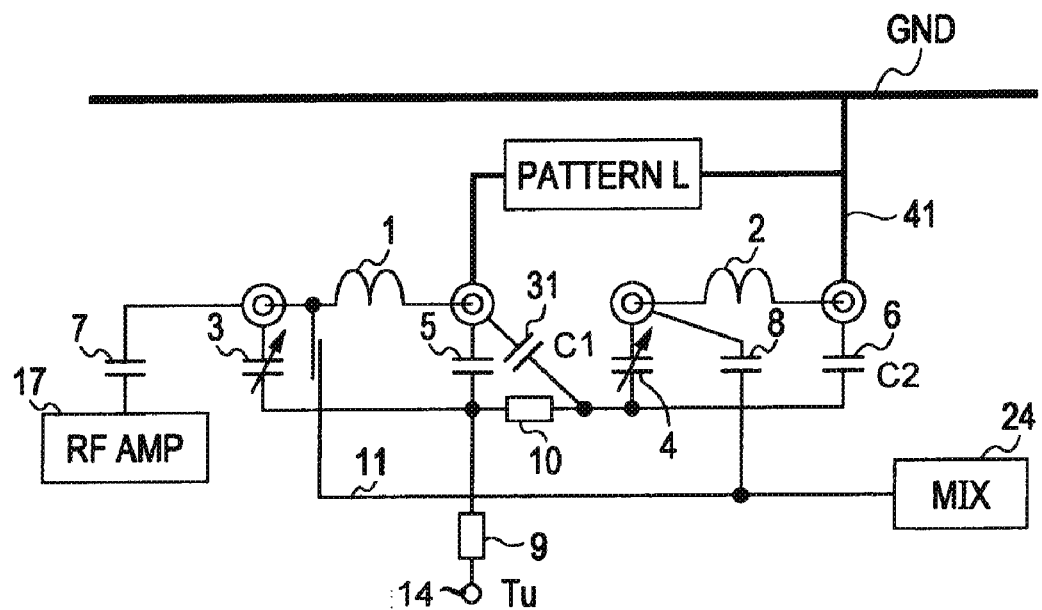
FIG. 2 shows a schematic circuit diagram in which grounds are integrated to form one ground in the embodiment of the present invention.

FIG. 2 shows a schematic circuit diagram in which the ground GND of the first inductor 1 and the ground GND of the second inductor 2 are integrated using the pattern L so as to form one ground GND in the double-tuning circuit of the television tuner. Here, components which are the same as those indicated in the double-tuning circuit shown in FIG. 1 are denoted by the same reference numerals, as those of ordinary skill in the art will understand without further explanation. The ground GND is formed near the first inductor 1 and the second inductor 2, and a part 41 of the ground GND extends to one terminal of the second inductor 2 and is conductively connected thereto. The pattern L is formed between a ground-side terminal of the first inductor 1 and the part 41 of the ground GND. One terminal of the pattern L is conductively connected to one terminal of the first inductor 1, and the other terminal of the pattern L is conductively connected to the part 41 of the ground GND. That is, band characteristics are made uniform utilizing frequency characteristics of the pattern L, which is the third inductor, by integrating the ground GND of a primary inductor (the first inductor 1) and the ground GND of a secondary inductor (the second inductor 2) using the pattern L, and by capacitively connecting a cathode (a ground-side terminal) of the second variable capacitive element 4 to the pattern L, which has been provided to obtain the integrated ground GND.

Figure 3:
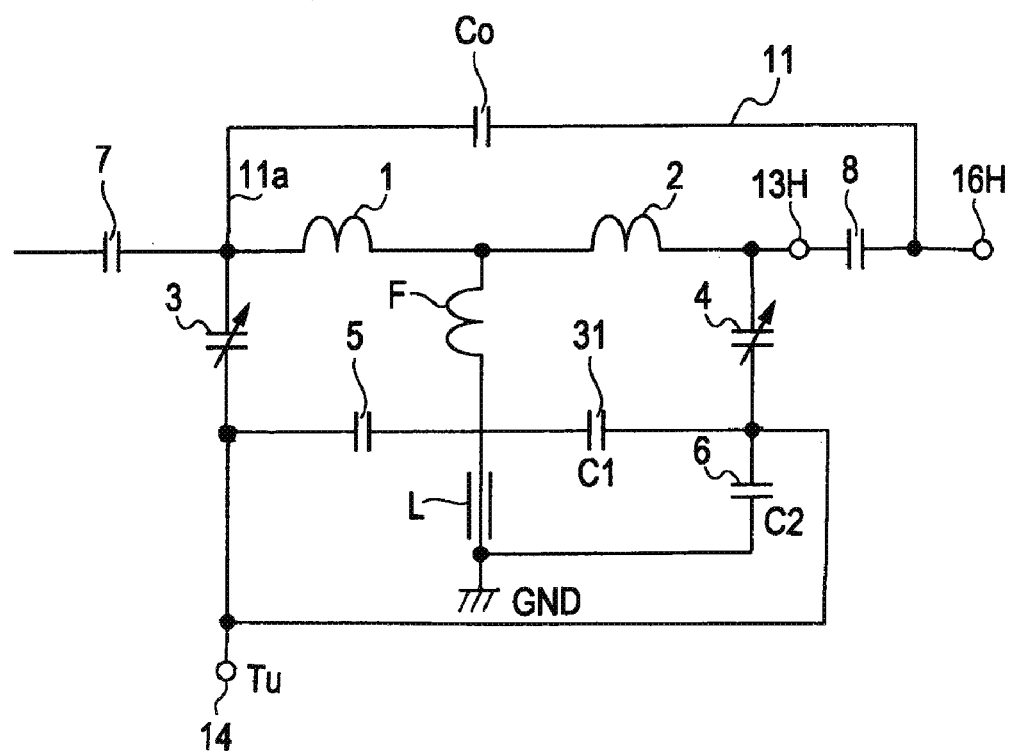
FIG. 3 shows a circuit diagram which is equivalent to the double-tuning circuit of the television tuner according to the embodiment of the present invention.

FIG. 3 shows a circuit diagram which is equivalent to the double-tuning circuit of the television tuner according to the embodiment of the present invention. Here, components which are the same as those indicated in the double-tuning circuit shown in FIGS. 1 and 2 are denoted by the same reference numerals, as those of ordinary skill in the art will understand without further explanation. The radio frequency amplifier (RF AMP) 17 and the frequency mixing circuit (MIX) 24 are not shown in FIG. 3. A portion formed by coupling the first inductor 1 and the tip part 11a of the copper-foil pattern 11 has an infinitesimal capacitance Co, which is generated by coupling the first inductor 1 and the tip part 11a of the copper-foil pattern 11. The portion is connected in parallel with the first inductor 1 and the second inductor 2. The capacitance of the secondary tuning circuit is divided into a capacitance C1 of the capacitor 31 and a capacitance C2 of the DC blocking capacitor 6, and the capacitor 31 is connected to the ground via the pattern L and the DC blocking capacitor 6 is directly connected to the ground. The coupling of the first inductor 1 and the second inductor 2 is represented by F.

Next, the operation of the double-tuning circuit of the television tuner having the above-described structure will be described. In the upstream circuit, an RF signal is input to the radio frequency amplifier (RF AMP) 17 from the antenna tuning circuit (ANT TUNING) 32, as shown in FIG. 1. The amplified RF signal is supplied to the hot-side output terminal 15H of the upstream circuit, and is supplied to the hot-side input terminal 12H of the double-tuning circuit via the first coupling capacitor 7.

In the double-tuning circuit, the capacitance of the first variable capacitive element 3 and the capacitance of the second variable capacitive element 4 are adjusted by means of a tuning voltage applied to the tuning voltage application terminal (Tu) 14. With respect to the input RF signal, parallel resonance occurs in the primary tuning circuit including the first inductor 1 and the first variable capacitive element 3 and in the secondary tuning circuit including the second inductor 2 and the second variable capacitive element 4, whereby an RF signal of a desired frequency is selectively extracted, and the selected RF signal is supplied to the hot-side output terminal 13H. This RF signal is supplied to the hot-side input terminal 16H of the downstream circuit via the second coupling capacitor 8.

With respect to an image frequency component in an RF signal, a trap circuit for attenuating an image frequency component in an RF signal is formed to have the infinitesimal capacitance Co (shown in FIG. 3) generated by coupling the first inductor 1 and the tip part 11a of the copper-foil pattern 11. This trap circuit can attenuate an image frequency component in an RF signal.

Moreover, in the embodiment of the present invention, the cathode (the ground-side terminal) of the second variable capacitive element 4 is connected to one terminal of the pattern L via the capacitor 31, and is connected to the ground GND via the pattern L. Thus, the secondary tuning circuit of the secondary tuning capacitance is grounded via the pattern L. Thus, because of the frequency characteristics of the pattern L, which is the third inductor, loose coupling occurs in radio frequencies and close coupling occurs in low frequencies, whereby the band characteristics are made uniform.

Figure 4:
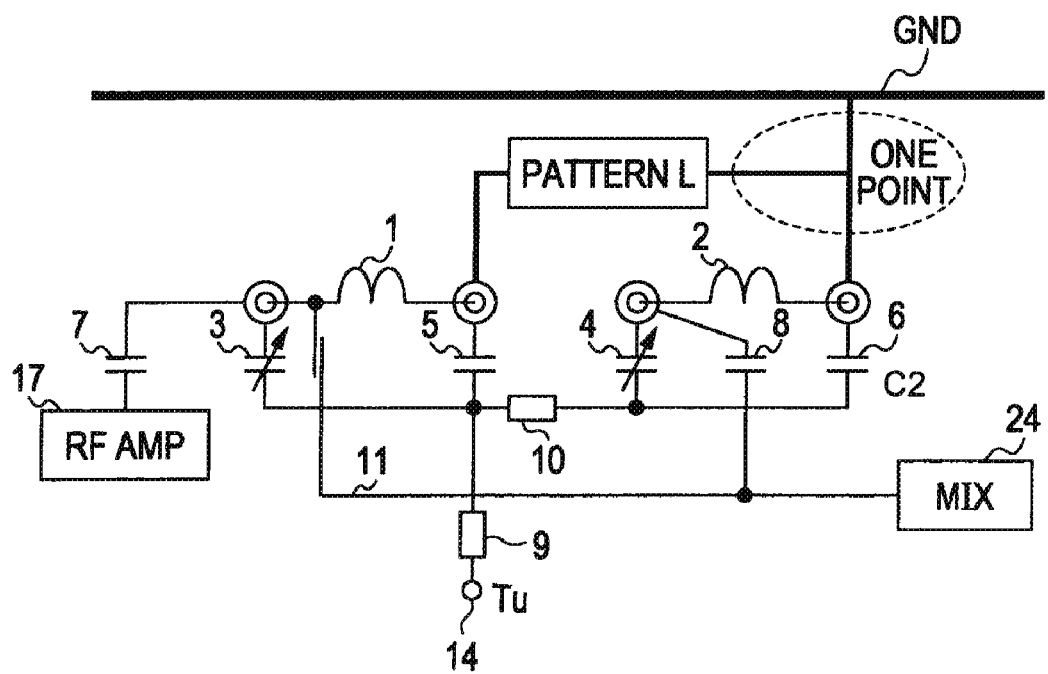
FIG. 4 is a circuit diagram of a double-tuning circuit according to a comparative example.

Here, the relationship between an image frequency and a trap frequency will be described by comparing the double-tuning circuit shown in FIG. 2 with a double-tuning circuit shown in FIG. 4. In FIG. 4, components which are the same as those indicated in the double-tuning circuit shown in FIGS. 1, 2, and 3 are denoted by the same reference numerals, as those of ordinary skill in the art will understand without further explanation. In the double-tuning circuit shown in FIG. 4, the anode of the second variable capacitive element 4 is connected to the ground GND via the DC blocking capacitor 6, not via the pattern L.

FIGS. 5A, 5B, 5C, 5D, 6A, 6B, 6C, 6D, 7A, 7B, 7C, 7D, 8A, and 8B are diagrams showing results obtained by simulating the relationship between the image frequency and the trap frequency when the tuning frequency is changed between 861 MHz and 369 MHz in the two double-tuning circuits described above. In the simulation for the double-tuning circuit shown in FIG. 2, the capacitance of the DC blocking capacitor 6 is set to 0 and the capacitance of the capacitor 31 is set to 75 pF. In the simulation for the double-tuning circuit shown in FIG. 4, the capacitance of the DC blocking capacitor 6 is set to 75 pF.

Figure 5A:
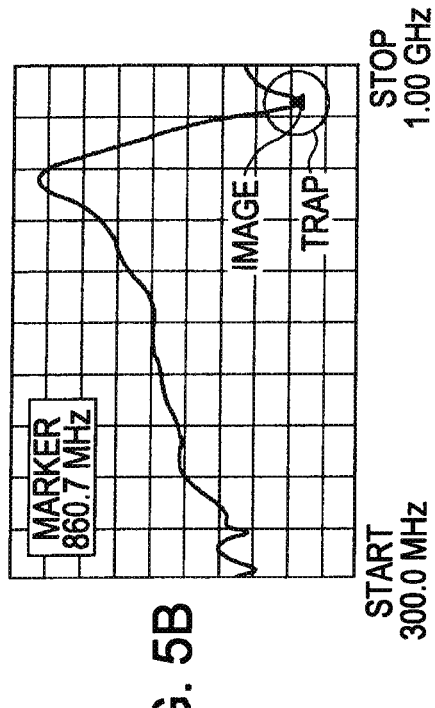
FIG. 5A is a diagram showing a relationship between an image frequency and a trap frequency in the comparative example when a tuning frequency is 861 MHz.
Figure 5B:
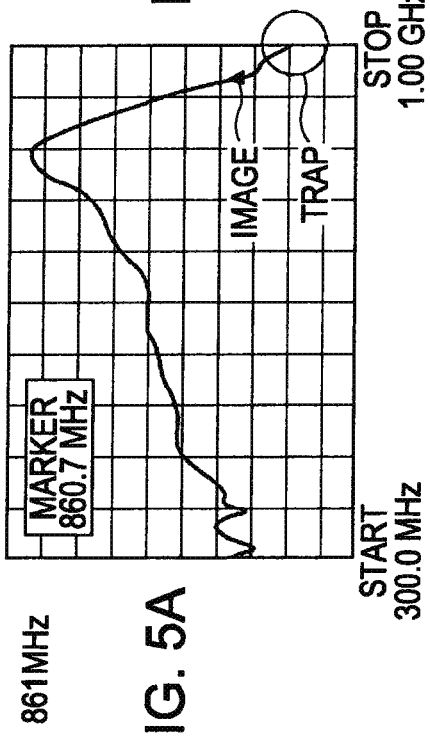
FIG. 5B is a diagram showing a relationship between an image frequency and a trap frequency in the embodiment of the present invention when a tuning frequency is 861 MHz.
Figure 5C:
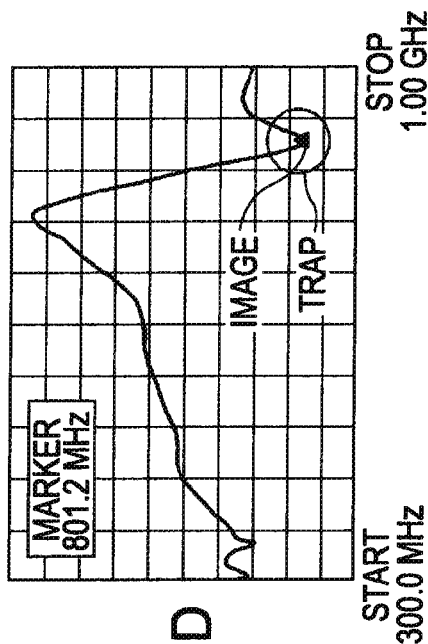
FIG. 5C is a diagram showing a relationship between the image frequency and the trap frequency in the comparative example when the tuning frequency is 801 MHz.
Figure 5D:
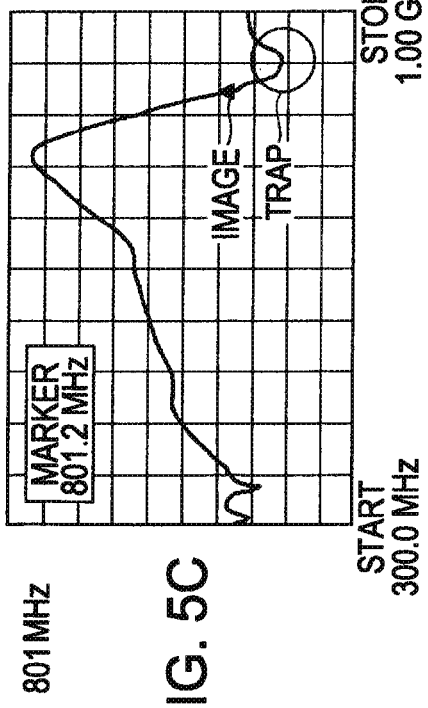
FIG. 5D is a diagram showing a relationship between the image frequency and the trap frequency in the embodiment of the present invention when the tuning frequency is 801 MHz.

FIG. 5A shows a result of simulation for the double-tuning circuit shown in FIG. 4 with 75 PF for the second capacitance (C2) in the secondary tuning circuit. FIG. 5B shows a result of simulation for the double-tuning circuit shown in FIG. 2 with 75 PF for the first capacitance (C1) in the secondary tuning circuit. As shown in FIG. 5A, since the trap frequency (TRAP) is higher than the image frequency (IMAGE) in the double-tuning circuit shown in FIG. 4, the image frequency component cannot be sufficiently attenuated by the trap circuit. On the other hand, as shown in FIG. 5B, since the image frequency (IMAGE) matches the trap frequency (TRAP) in the double-tuning circuit shown in FIG. 2, the image frequency component can be sufficiently attenuated by the trap circuit. FIGS. 5C and 5D show results of simulation obtained when the tuning frequency is lowered by 60 MHz from that of FIGS. 5A and 5B, respectively. Lowering the tuning frequency lowers the image frequency (IMAGE) and the trap frequency (TRAP). In the double-tuning circuit shown in FIG. 4, as shown in FIG. 5C, the gap between the image frequency (IMAGE) and the trap frequency (TRAP) becomes small; however, the image frequency component still cannot be sufficiently attenuated by the trap circuit. On the other hand, as shown in FIG. 5D, the image frequency (IMAGE) becomes lower in the double-tuning circuit shown in FIG. 2 and the trap frequency (TRAP) also becomes lower since the pattern L causes a degree of coupling to be increased, whereby the image frequency component can be sufficiently attenuated by the trap circuit.

Figure 6A:
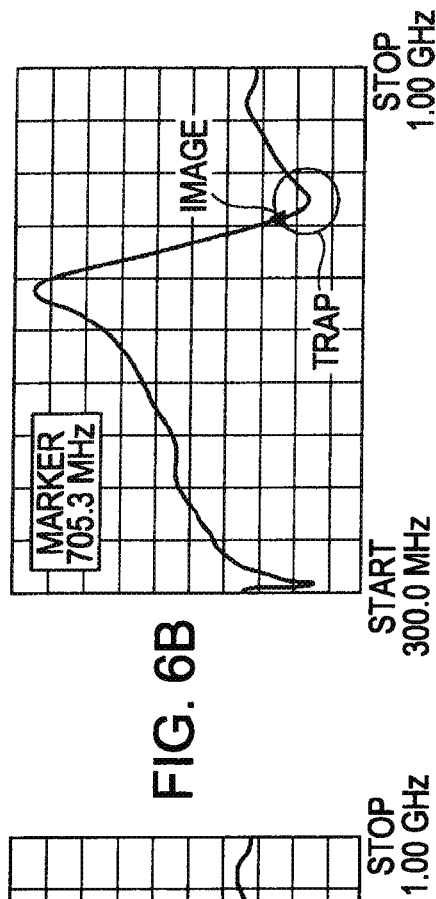
FIG. 6A is a diagram showing a relationship between the image frequency and the trap frequency in the comparative example when the tuning frequency is 705 MHz.
Figure 6C:
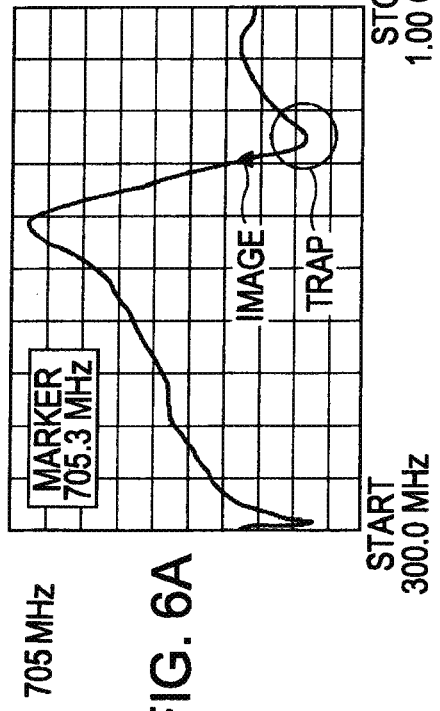
FIG. 6C is a diagram showing a relationship between the image frequency and the trap frequency in the comparative example when the tuning frequency is 603 MHz.
Figure 6B:
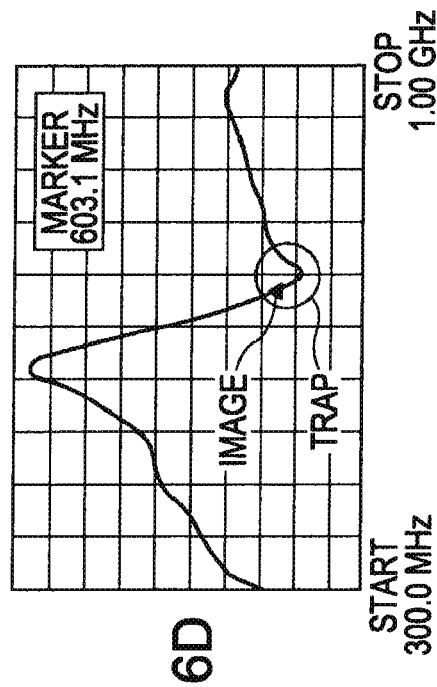
FIG. 6B is a diagram showing a relationship between the image frequency and the trap frequency in the embodiment of the present invention when the tuning frequency is 705 MHz.
Figure 6D:
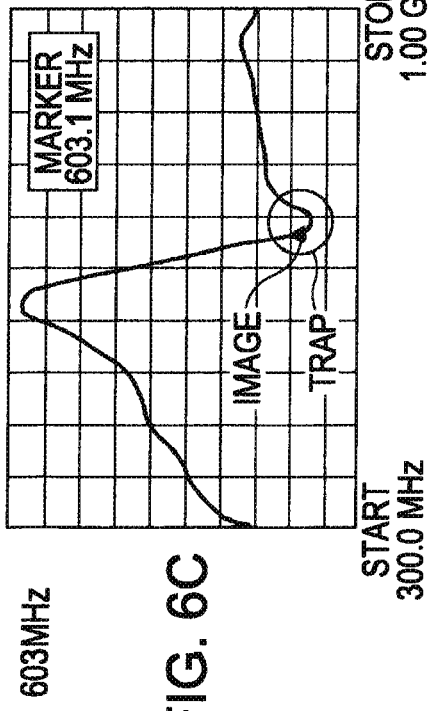
FIG. 6D is a diagram showing a relationship between the image frequency and the trap frequency in the embodiment of the present invention when the tuning frequency is 603 MHz.

FIGS. 6A and 6B show results of simulation obtained when the tuning frequency is lowered to 705 MHz, with 75 PF for the second capacitance (C2) and the first capacitance (C1) in the secondary tuning circuit, respectively. FIGS. 6C and 6D show results of simulation obtained when the tuning frequency is lowered to 603 MHz. As shown in FIGS. 6A through 6D, as the tuning frequency is lowered, the amount of lowering of the trap frequency (TRAP) becomes greater than the amount of lowering of the image frequency (IMAGE). As shown in FIG. 6C, when the tuning frequency is 603 MHz, the image frequency (IMAGE) matches the trap frequency (TRAP) even in the double-tuning circuit shown in FIG. 4, whereby the image frequency component can be sufficiently attenuated by the trap circuit.

FIGS. 7A and 7B show results of simulation obtained when the tuning frequency is lowered to 501 MHz, with 75 PF for the second capacitance (C2) and the first capacitance (C1) in the secondary tuning circuit, respectively, and FIGS. 7C and 7D show results of simulation obtained when the tuning frequency is lowered to 405 MHz. As shown in FIG. 7A, until when the tuning frequency is lowered to about 501 MHz in the double-tuning circuit shown in FIG. 4, the image frequency (IMAGE) and the trap frequency (TRAP) are still in the same range. However, when the tuning frequency is lowered to 405 MHz as shown in FIG. 7C, the trap frequency (TRAP) becomes lower than the image frequency (IMAGE), whereby it comes about that the image frequency (IMAGE) no longer matches the trap frequency (TRAP). On the other hand, in the double-tuning circuit shown in FIG. 2, since the pattern L causes the degree of coupling to be increased, the trap frequency (TRAP) and the image frequency (IMAGE) become lower together, whereby the image frequency component can be sufficiently attenuated by the trap circuit.

Figure 8A:
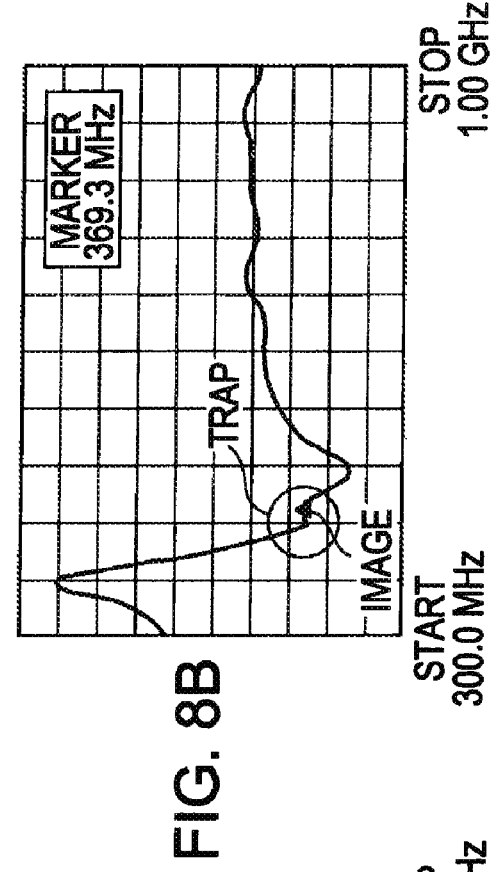
FIG. 8A is a diagram showing a relationship between the image frequency and the trap frequency in the comparative example when the tuning frequency is 369 MHz.
Figure 8B:
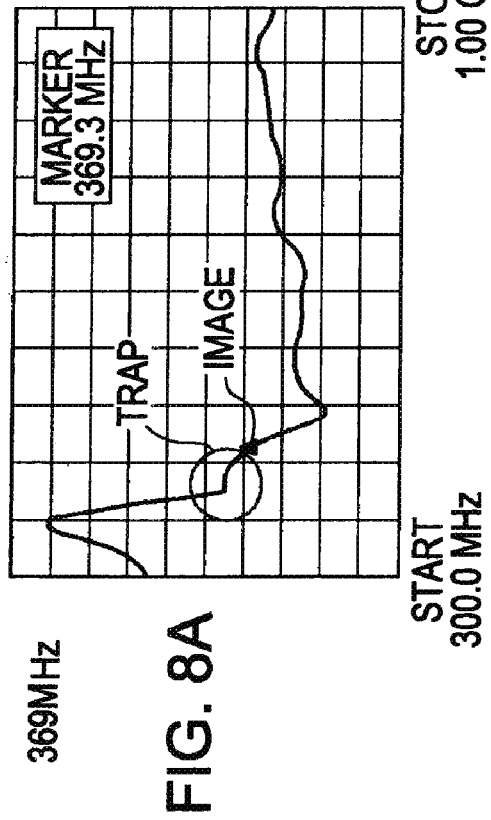
FIG. 8B is a diagram showing a relationship between the image frequency and the trap frequency in the embodiment of the present invention when the tuning frequency is 369 MHz.

FIGS. 8A and 8B show results of simulation obtained when the tuning frequency is lowered to 369 MHz, with 75 PF for the second capacitance (C2) and the first capacitance (C1) in the secondary tuning circuit, respectively. In the double-tuning circuit shown in FIG. 4, the image frequency (IMAGE) does not match the trap frequency (TRAP) as shown in FIG. 8A; however, in the double-tuning circuit shown in FIG. 2, the image frequency (IMAGE) still matches the trap frequency (TRAP) as shown in FIG. 8B, whereby the image frequency component can be sufficiently attenuated by the trap circuit.

As described above, according to the embodiments of the present invention, a circuit structure is provided in which the secondary tuning circuit of the secondary tuning capacitance is grounded via the pattern L. Thus, because of the frequency characteristics of the inductor included in the pattern L, loose coupling occurs in radio frequencies and close coupling occurs in low frequencies, and the trap frequency can be corrected between channels, whereby resistance to image degradation can be uniformly achieved between channels.

The present invention can be applied to a double-tuning circuit of a television tuner in which a trap circuit for attenuating an image frequency component of a television signal is formed.

What is claimed is:

1. A double-tuning circuit of a television tuner, the double-tuning circuit comprising:
   a primary tuning circuit in which a first inductor is connected in parallel with a first variable capacitive element;
   a secondary tuning circuit in which a second inductor is connected in parallel with a second variable capacitive element, the second inductor being inductively coupled to the first inductor;
   a coupling capacitor connected in series between a hot-side output terminal of the secondary tuning circuit and an input terminal of a downstream circuit;
   a pattern used to form a trap circuit for attenuating an image frequency component of a received television signal, the trap circuit being formed to have an infinitesimal capacitance generated between a tip part of the pattern and the first inductor when a fixed part of the pattern is connected to a connection point at which the coupling capacitor is connected to the input terminal of the downstream circuit and the tip part of the pattern extends to near the first inductor;
   a third inductor formed between a ground-side terminal of the first inductor and a ground;
   a first capacitor connected between a connection point at which the first inductor is connected to the third inductor and a ground-side terminal of the second variable capacitive element; and
   a second capacitor connected between a ground-side terminal of the second variable capacitive element and the ground.

2. The double-tuning circuit of the television tuner according to claim 1, wherein the pattern is comprised of a copper-foil pattern.

* * * * *